United States Patent
Draxelmayr

(10) Patent No.: US 7,046,178 B2
(45) Date of Patent: May 16, 2006

(54) METHOD AND DEVICE FOR THE CALIBRATION OF A WEIGHTED NETWORK

(75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 183 days.

(21) Appl. No.: 10/810,050

(22) Filed: Mar. 26, 2004

(65) Prior Publication Data

US 2004/0227652 A1    Nov. 18, 2004

(51) Int. Cl.
*H03M 1/10* (2006.01)

(52) U.S. Cl. .................. 341/120; 341/150; 341/172

(58) Field of Classification Search ............... 341/144, 341/145, 149, 150, 155, 156, 171, 172, 118, 341/120

See application file for complete search history.

(56) References Cited

U.S. PATENT DOCUMENTS

| | | | |
|---|---|---|---|
| 5,162,801 A | * | 11/1992 | Powell et al. ............... 341/150 |
| 5,675,340 A | * | 10/1997 | Hester et al. ............... 341/156 |
| 5,745,060 A | * | 4/1998 | McCartney et al. ......... 341/120 |
| 6,292,125 B1 | | 9/2001 | Conroy |
| 6,600,437 B1 | * | 7/2003 | Confalonieri et al. ....... 341/150 |

FOREIGN PATENT DOCUMENTS

| | | |
|---|---|---|
| DE | 691 22 404 T2 | 7/1990 |
| EP | 0 320 642 B1 | 11/1988 |

\* cited by examiner

*Primary Examiner*—John B Nguyen
(74) *Attorney, Agent, or Firm*—Brinks, Hofer Gilson & Lione

(57) ABSTRACT

Improved methods for the calibration, in particular for self-calibration, of an A/D or D/A converter with weighted network (CN) are proposed. Only a relevant part of the weights (C0, C1, C2, Cn) is calibrated by measurement. In addition, by iterative repetition of measurements used for the calibration a noise is used for increasing a resolution. Finally, possibilities for dealing with the offset are illustrated. Complementary equations are set up and the offset is eliminated by subtraction. If an equation necessary for calibration cannot be directly set up because of an overflow, this is resolved by using special binary codes which indicate which weights are enabled and/or disenabled, and their conversion.

20 Claims, 1 Drawing Sheet

1. A FIRST BINARY CODE 1 IS DEFINED
2. A SECOND BINARY CODE 2 COMPLEMENTARY TO THE FIRST BINARY CODE IS FORMED
3. BIT VALUES ARE MODIFIED SUCH THAT THE VALUE OF THE BINARY CODE REMAINS EQUAL
4. A FOURTH BINARY CODE COMPLEMENTARY TO THE THIRD BINARY CODE IS FORMED BY INVERTING THE INDIVIDUAL BITS
5. A FIFTH BINARY CODE IS GENERATED FROM THE FOURTH BINARY CODE

METHOD AND DEVICE FOR THE CALIBRATION OF A WEIGHTED NETWORK

FIELD OF THE INVENTION

The present invention relates to a calibration method for redundant analog to digital (A/D) and digital to analog (D/A) converters with weighted network and A/D and/or D/A converters for the execution of such a method. Applicant claims priority under 35 U.S.C. § 1.119 to German Application DE 103 14 189.8, filed on Mar. 28, 2003.

BACKGROUND OF THE INVENTION

An important interface between different types of systems is a connection between analog and digital parts of the systems. In order to correctly convert the signals on this connection, A/D and/or D/A converters are required.

In the case of many types of A/D and D/A converters, reference elements are needed which derive further variables, and for the A/D and/or D/A conversion from a pre-set reference variable, such as a reference voltage. These reference elements form a weighted network and are designated as weights as described below. In practice, the weighted networks are implemented, for example, with resistors, transistors or capacitors. Such A/D converters work, for example, according to the successive approximation methods. A converter with charge distribution (and redistribution) can be taken as a representative example, in which case the weighted network consists of capacitances. Weighted resistance networks are used, for example, in converters based upon method of weighted currents or with a ladder network (R-2R). Since the weights serve as a reference for the conversion, it is important that the weight values, for example the capacitor values, relate to one another in an accurate pre-set ratio. However, problems can result because the weights cannot be manufactured with sufficient accuracy.

Therefore a calibration of the weighted network is necessary. A possible solution for this is self-calibration, for example, is described in EP 0320642 B1.

DETAILED DESCRIPTION OF THE DRAWINGS

Figure 1:
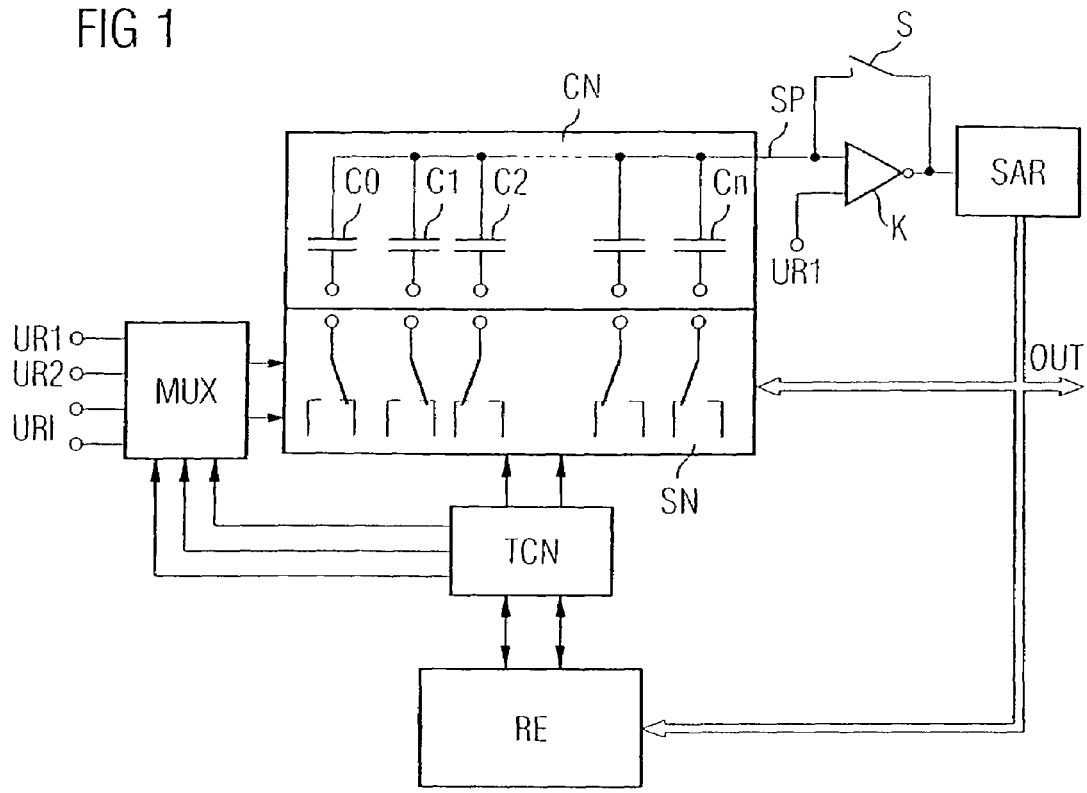
FIG. 1 is an A/D converter according to an embodiment of the present invention.

FIG. 1 shows an example of a corresponding A/D converter, which is designed for the self calibration of a capacitance network CN with individual weights and/or capacitances C0 to Cn. A corresponding switch network SN is assigned to the capacitances C0 to Cn. Individual capacitances of the capacitance network can be enabled and/or disenabled by these switches. That is to say a voltage can be applied alternatively to the respective capacitance, which again leads to a charge on the capacitance.

An analog signal lying on an input UI is thereby converted from analog to digital, for example, via the method of successive approximation. The output (i.e. the summation point SP of the weighted capacitance network CN) is connected to an input of a comparator K, downstream of which is a successive approximation register SAR. In addition, the comparator has a feedback, which is to be opened or closed via a switch S. The outputs of the successive approximation register SAR corresponding to the internal number n+1 of the bits, which corresponds to the number of the weights, form the digital output OUT of the converter and are also fed back to the switch network SN and a counter RE. An input multiplexer MUX with inputs, which are defined for the analog signal to be converted by two reference voltages UR1 and UR2 as well as by the input UI, leads on the output side to the switch network SN. A time monitoring unit and a calibration logic TCN for executing the calibration control both the multiplexer MUX and the switch network SN communicate with the computing unit RE. The time monitoring unit and calibration unit on the one hand and the counter on the other hand together form a control unit, by means of which self-calibration can be carried out.

In the case of the example illustrated in FIG. 1, self-calibration takes place in such a manner that equations between the values of the individual capacitances C0 to Cn are set up by experiments or measurements. A capacitance is represented in each case preferably as a sum of the capacitances with lower value. In the example illustrated, for example, C0 is the lowest capacitance and Cn the largest capacitance; thus they correspond to the least significant bit (LSB) and the most significant bit (MSB), respectively.

The corresponding equations between the capacitances can be determined by a measurement and/or an experiment as follows: first a total charge, which corresponds to a voltage lying on the comparator K via the capacitances is brought onto the capacitance network from an input voltage in the case of specific switching positions of the switch network SN and closed switch S. This total charge is now kept constant, by opening the switch S, which is also called sampling. Now, for example, if the value of the capacitance C3 is determined as a function of the values of the capacitances C0 to C2, the switch corresponding to the capacitance C3 of the switch network SN is changed over. That is to say, the bit value, which corresponds to the capacitance C3, is modified. Subsequently, the capacitances C0 to C2 are so manipulated via their corresponding switches that the voltage lying on the summation point SP remains at least approximately constant, which is determined by the comparator K. From the changes of the switches corresponding to the capacitances C0 to C2, it is then clear by which capacitances C0 to C2 the capacitance C3 can be represented, resulting in an equation between C3 and C0 to C2.

A specific switching position therefore can be represented by a binary code, whereby a 1 indicates an enabled weight and 0 a disabled weight. In the case of 6 capacitors, such a binary code could read 111000. This means that the capacitances C0, C1 and C2 are disabled and the capacitances C3, C4 and C5 are enabled.

If an equation is determined as above for all capacitances C1 to Cn, a set of equations of the following type results.

$$C1 = D10 \cdot C0 \tag{1}$$

$$C2 = D20 \cdot C0 + D21 \cdot C1$$

$$C3 = D30 \cdot C0 + D31 \cdot C1 + D32 \cdot C2$$

$$\vdots$$

$$Cn = Dn0 \cdot C0 + Dn1 \cdot C1 + Dn2 \cdot C2 + \cdots + Dn(n-1) \cdot C(n-1)$$

where $Dij \in \{0;1\}$

With the help of this set of equations, the relative weight values of the capacitances C1 to Cn can be computed with regard to the weight value of the capacitance C0 by the computing unit RE. These are standardized on the total value, also called "full scale", which is determined according to the following equation, in which FS designates the total value:

$$C0+C1+C2+\ldots+Cn=FS \quad (2)$$

This method of self calibration is in particular also suitable for so-called redundant converters, in the case of which the capacitances are not binary weighted, thus C0: C1: C2 ... =1:2:4:8 etc. does not apply, but the ratio of the weight values of sequential weights is less than two. In the case of such redundant converter networks the equations from set of equations (1) are generally not unequivocally defined, since there may be several possibilities of representing a capacitance as a function of the lower capacitances.

An analog calibration method can be applied to other kinds of weights, for example resistors.

With regard to such calibration methods, various problems may occur:

1. With a correspondingly large number of capacitances, the number of equations is correspondingly high. Thus, the number of measurements or experiments rises for determining the equations of set of equations 1, which means an increased time requirement. During this period, the converter cannot be used to convert signals.

2. The equations for the capacitances with lower weight value are generally relatively inaccurate, since only few low value capacitances are used to represent a capacitance. For example, if C1 is 1.8 times the value of C0, the first equation of the set of equations 1 would read C1=1·C0, meaning an error of 80%.

3. A noise of the system can lead to unclear calibration results. That is to say, when determining an equation the coefficients Dij can differ due to the noise each time the equation is determined.

4. In practice, contingent on the circuit an offset can arise in the sets of equations, which renders the calibration result inaccurate and thus the accuracy of the converter is negatively affected. In this connection, charge redistribution converters were proposed similar to that shown in FIG. 1, in which the comparator K has several stages and correspondingly several feedbacks with switches S. By sequential opening of the switches during sampling, the offset can be minimized. However, as a result, no defined sampling behavior of the converter is achieved, which is necessary for dynamic input signals. Alternatively, an offset voltage of the comparator can be compensated by an auxiliary network, which means additional circuit complexity.

It is therefore an object of the present invention to provide an improved calibration method as well as a corresponding A/D or D/A conversion device, with which the above problems are resolved and which calibration takes place more accurately, with less time expended and under consideration of noise and offset.

It is proposed according to the invention to assume a part of weight value ratios of a weighted network as fixed and only to calibrate the remaining weights. Preferably, weight value ratios of the lower value weights to one another are assumed to be fixed. In the case of low value weights, these fixed ratios are generally determined more accurately than by measurements or experiments. In addition, the time expended is reduced, since fewer equations have to be set up.

The absolute values of these weights can be varied, for example in the case of standardization on a pre-set sum of all weights, where only the ratios are assumed to be fixed.

For dealing with the noise, it is proposed to repeat definition of at least one equation to determine the weight values of the weights two or more times, and to calculate the corresponding coefficients of the at least one equation to determine the weight values by averaging the different measurements.

Furthermore, according to the invention various methods for considering an offset are proposed. A first possibility according to the invention in this connection is to set up two complementary equations (i.e. equations with reverse signs). Since the offset has the same sign in each case, when the equation is set up in such a case, this offset can be eliminated by subtraction of the equations.

Another possibility for considering if an offset is necessary is if the offset prevents an equation being set up to determine the weight values. For this purpose, it is proposed according to the invention, for determining the equation, to convert a first binary code, in which case of which each bit value denotes an enabled or disenabled weight, into an equivalent binary code with equal value in such a manner that the equation can be determined by comparing the first binary code with the equivalent binary code. The sum of all weight values of the weights enabled according to this binary code is thereby understood under the value of a binary code.

An offset can also be separately determined according to the invention by conversion of a binary code into a second binary code, which only differs by the offset from the first binary code, and can be considered either by adding with the correct sign to a conversion result or by pre-charging and/or pre-assigning the weights during the conversion process with the corresponding offset.

These different methods can be used individually or even combined, depending on the requirement and type of converter.

Figure 2:
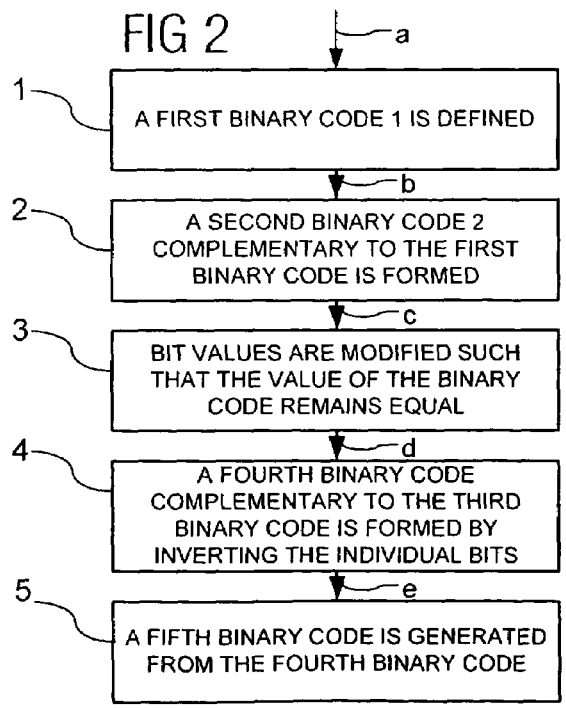
FIG. 2 is a flow chart showing a method for compensating for offset according to an embodiment of the present invention.

The invention is described in detail below with reference to the accompanying drawings on the basis of preferred embodiments, wherein:

FIG. 1 shows a self-calibrating analog/digital converter with weighted capacitor network, and FIG. 2 shows a flow chart of a method according to the invention for determining an equivalent binary code to prevent offset problems.

The analogue-digital converter illustrated in FIG. 1 has already been described in detail in the introduction and is also suitable as an example for the application of the methods according to the invention. In contrast to a conventional converter, the control unit consisting of the computing unit RE and the time monitoring unit and calibration logic TCN is configured here for executing the methods according to the invention.

It is pointed out that the methods are not only applicable to weighted capacitance networks with redundant converters, but can apply generally to capacitive converters, resistive converters, differential converters, converters with voltage or current input etc.

As described in the introduction, the weight values of the capacitances C0 to Cn are determined for the purpose of calibration. This requires in the case of a large number of capacitances a correspondingly high time expended. In practice, in particular, the low order capacitances C0, C1 ... Cm (m≦n) and/or their ratios to one another do not always need to be determined, their weight values and/or their mutual ratios in good approximation can also be assumed as predetermined. Since relative errors in the case of the low order capacitances do not have a great effect on the final result of the analog-digital conversion process, such as errors in the case of capacitances C(m+1) . . . ,Cn, correspond to bits of higher order. In addition, greater accuracy can be obtained as a result of this arrangement. If the ratio C1:C0 amounts to nominal 1.8 and, contingent on manufacturing tolerances, in reality is 1.82, it is more accurate to assume the nominal ratio 1.8 as being fixed. This is because the determination of the ratio by measurement and/or experiment would lead, as described in the introduction, to the result C1:C0=1, which is substantially more inaccurate.

The ratios and/or weight values, which can be assumed here as predetermined, depends on the required accuracy and thus on the respective application.

The set of equations 1 illustrated in the introduction is therefore reduced to the following set of equations 3:

$$C(m+1) = D(m+1)0 \cdot C0 + D(m+1)1 \cdot C1 + \cdots + D(m+1)m \cdot Cm \quad (3)$$

$$\vdots$$

$$Cn = Dn0 \cdot C0 + Dn1 \cdot C1 + Dmn \cdot Cm + \cdots + Dn(n-1) \cdot C(n-1)$$

As a result of this set of equations 3, the relative weight values of the capacitances C(m+1) to Cn are determined by the method already described in the introduction. Thus, the method and solving of the set of equations is simpler and requires less computing time.

Real circuits, thus also real A/D or D/A converters, always have a certain noise. Therefore when the sets of equations 1 or 3 illustrated above are determined, the coefficients Dij in the case of iterated determination of an equation cannot be accurately reproduced. It is proposed according to the present invention to use this characteristic for increasing the resolution. If, for example, an equation is determined ten times, and three times the value 0 and seven times the value 1 is calculated for a specific coefficient Dij, the coefficient can be set to the corresponding average value 0.7. This value with high probability is more accurate than the value 1, which in this case would result from a majority decision. It therefore applies to the entire set of equations 1 or 3 that the coefficients Dij now no longer can assume only the values 1 (for an enabled weight and/or a weight, which is necessary for representing the respective weight standing on the left side of the equation) and 0 (for a weight, which is disabled and/or is accordingly not necessary), but arbitrary values between 0 and 1. In all other respects, the process is carried out just with the conventional method (i.e. the corresponding set of equations is solved by the computing unit RE). If the number of measurements, which are averaged, is a number to the power-of-two, execution of the arithmetic is particularly simple. This method is not only applicable to the type of sets of equations described here, but for example also to sets of equations, which instead of the coefficients Dij, use voltage correction factors, which describe the ratio of a capacitor to the sum of the lower order capacitors than this one capacitor.

A further problem, which arises with the application of self-calibration methods to weighted networks as illustrated in FIG. 1, is the so-called offset. This can be caused in the present example by charge carrier injection into the capacitance network CN or directly by the comparator K, for example. Accordingly, the equations in sets of equations (1) or (3) determined by the measurements comprise:

$$Ck = \sum_{i=0}^{k-1} Dki \cdot Ci + \text{Offset} \quad (4)$$

In the method described in the introduction, there are two possibilities for setting up the above equation (4). On the one hand the switch, which corresponds to the capacitance Ck, after sampling can be set from 0 to 1 and therefore the other necessary switching positions and/or coefficients can be determined. Alternatively it can be set in reverse from 1 to 0. This results in two complementary equations with opposite signs. With no offset, these equations are equivalent. In the case of an offset, this has the same sign in both cases. The second equation complementary to the equation 4 comprises:

$$-Ck = -\sum_{i=0}^{k-1} Dki \cdot Ci + \text{Offset} \quad (5)$$

If equation (5) is now subtracted from equation (4), the offset is thus shortened. If the resulting equation is again divided by two, the equation required for determining the weight values with no offset is obtained.

It should be noted here that because of the noise mentioned above and because of the offset the coefficients, Dki may be different in equations (4) and (5). This problem can be resolved similarly as described above by averaging. Equations (4) and (5) can also be determined several times in each case and for determining the coefficients using the equations determined in this way are averaged accordingly.

A further problem, which may be caused by an offset, is that it may not be possible to set up an equation at all by the method described in the introduction, because this would lead to an overflow. If this is the case, for example, due to the offset, more capacitances would have to be enabled or disabled by corresponding operation of the switches than are actually present. This problem can be resolved without the aid of further analog means such as auxiliary networks for offset compensation as a result of the method according to the invention described in the following. The steps necessary for this are illustrated in a flow chart in FIG. 2. An output or first binary code 1 is defined at first in a step a. This binary code describes the switching positions of the switch network SN, whereby a "1" corresponds to an enabled capacitance and "0" to a disabled capacitance. For this purpose, a capacitance is selected, which one wants to determine as a function of the lower order capacitances. In addition, it is determined whether the bit value corresponding to this capacitance Ck of the first binary code should be set from 1 to 0 or from 0 to 1. This bit value is then set in each case to the initial value defined in this way, the bits of lower order are set to the value 1 or 0 complementary to this. The bit values of higher order are thereby inconsequential, these being set expediently in such a way that the value of the first binary code preferably lies in the center of the range, which can be represented by the values of such a binary code, or at least sufficiently far away from the edges of the range, so that with the following steps the result can still be represented also under consideration of the offset. Under the value of the binary code is understood thereby the sum of the weight values of the enabled capacitances. In the case of the bit values corresponding to the highest order capacitances, this is naturally not possible. With redundant converters the "reserve" produced by the redundancy however is to ensure that generally no offset problems arise when the corresponding equation is determined.

If one wants to determine the weight value of C9 for example in a 12-bit binary code corresponding to 12 capacitances C0 to C11 as a function of the weight values of the capacitances C0 to C8, the first code would, for example, appear in such a way: 100 111 111 111, whereby the bit value corresponding to capacitor C9 is underlined.

The second binary code 2 complementary to this binary code is formed in a step b (i.e. all bits are inverted). The second binary code 2 in the above example would then be 011 000 000 000.

On the basis of this second binary code 2 essentially the measurement described in the introduction is implemented in a further step c (i.e. the bit values are modified in such a way that the value of the binary code remains equal, which is verified in the device of FIG. 1 by the comparator K). The third binary code 011 000 001 101 3 could result therefore in the above example. This third binary code 3 apart from an offset is equivalent to the second binary code 2. As can be seen, in this example the bit corresponding to the capacitance C9 has again received the value 1, in the case of the bit values, which correspond to C0, C2 and C3, modifications having resulted. In this example, the offset would therefore be 000 000 001 101.

In a step d the fourth binary code 4 complementary to this third binary code 3 is formed by inverting the individual bits. An example of this fourth binary code 4 would then be 100 111 110 010.

As the result of an analog process as in step b, a fifth or equivalent binary code 5 is then generated from this fourth binary code 4 in step e. A possible example here is 101 000 000 110. This fifth binary code 5, as will be demonstrated in the following, is equivalent to the first binary code 1. By comparing the first binary code 1 with the fifth binary code 5 the desired equation can thus be determined, in the present case C9=C8+C7+C6+C5+C4+C3+C0.

Next, it should be stated that the fourth binary code 4 is exactly that binary code, which can supply as a result the first binary code 1 when the method in step c and/or e is applied to the fourth binary code 4. That is to say, a distance between the fourth binary code 4 and the first binary code 1 is provided by the offset. This is essentially due to the fact that the third binary code 3 emanates from the second binary code 2 in step c through this type of method (distance=offset). The second binary code 2 and the third binary code 3 are again the complements of the first binary codes 1 and the fourth binary code 4, respectively, whereby their distances are also equal. This can also be seen more clearly by examining the behavior of the individual bit values. In the case of transition c from the second binary code 2 to the third binary code 3, a few bit values were set from 0 to 1, some bit values were set from 1 to 0 and some bit values have not changed. With regard to bit values which have changed, the following applies: the first binary code 1 was complemented in step b to the second binary code 2, then the bits have changed (=complemented, third binary code 3=first binary code 1 for these bits) and afterwards they were again complemented (fourth binary code 4=second binary code 2). Since as a result of the method in step c the second binary code 2 is converted into the third binary code 3, it also means that the fourth binary code 4 is transferred into the first binary code 1. With regard to bit values, which did not change, the following applies: the first binary code 1 was complemented in step b into the second binary code 2, in step c the bit values remain equal (third binary code 3=second binary code 2), afterwards they are again complemented (fourth binary code 4=first binary code 1).

This method can also be implemented with an offset. Thus the desired set of equations, whereby the calibration is possible can be set up. A further example with the same first and second binary codes 1 and 2 as above appears as follows:

| first binary code 1: | 100 111 111 111 |
| secondary binary code 2: | 011 000 000 000 |
| third binary code 3: | 010 111 010 110 |
| fourth binary code 4: | 101 000 101 100 |
| fifth binary code 5: | 101 000 011 101 |

This would then lead to the equation C9=C8+C7+C6+C5+C1.

Since the first 1 and second 2 binary code emanate from each other by simply inverting all bit values, the method can naturally also be begun on the basis of the second binary code with step c. The first binary code 1 is then explicitly determined later by inverting the bit values of the second binary code 2, or for determining the equation the second binary code 2 is compared using rules adapted accordingly to the equivalent binary code 5.

The calibration method can again be completed by correcting the offset also during normal A/D and/or D/A conversion. For this purpose, the procedure can be as follows: after the actual calibration phase any arbitrary binary code, preferably in the center of the range which can be represented, is simply selected, sampled and afterwards a binary code is converted retaining the total value. Thus a method or an experiment similarly as in steps c or e of the method illustrated in FIG. 2 and described above is carried out. If the sign of the offset is known, for a positive offset a binary code, whose bit values are constant 0 can be used, and for a negative offset a binary code, whose bit values are constant 1 can be used. As in the above method a few bit values, which are either set or reset and which correspond to the size of the offset, are obtained as a result.

From the preceding calibration, the weight value of the individual weights and thus the valency of the individual bits of the binary code are known. Therefore, the size of the offset as a sum and/or a difference of the weight values of the weights, which correspond to the set/reset bit values, is also known. Another possibility for determining the offset lies in adding the equations (4) and (5), which supplies double the offset value.

This value is stored. For improvement of the measurement accuracy, here again several measurements can be averaged. In order to correct the stored amount of offset each conversion result is therefore to be corrected accordingly, which can be effected by adding with the correct sign the offset to a conversion result.

Alternatively, the offset can also be corrected with analog means. The present invention again provides a method without the aid of an auxiliary network. As illustrated above, the offset can be determined by setting/resetting a few bit values. The analog value, which corresponds to the respective offset, can then either be subtracted from the input or fed into the comparator. The actual process depends on the respective circuit. In the case of charge redistribution of the A/D converter illustrated in FIG. 1, for example, the input voltage UI to be digitized can be applied onto the bits of higher order and/or capacitors with greater capacitance, while the capacitors with low capacitance are pre-charged onto the offset. With this method, however, it must be remembered that a so-called systematic gain error is also generated in this case, because the input charge, which corresponds to the applied input voltage, is now only stored on a part of the total network. With some applications this is not important. Otherwise, this can also be corrected digitally, by standardizing the weights in such a way that the sum of those weight values, which are used for sampling the input voltage, is standardized on the total value and/or "full scale".

What is claimed is:

1. A method of calibrating A/D or D/A converters with a weighted network, said method comprising the steps of:
    determining calibration equations between the weights, whereby in an equation a weight is represented as a function of other weights;
    to assuming the fixed values between a subset of the weights values for one or more ratios between the weight values of two weights; and
    determining the remaining ratio of the weight values by determining and solving the equations with the fixed values of the ratios.

2. The method of claim 1, wherein at least one ratio is a ratio between the weight values of a pre-set number of weights with the lowest weight values.

3. The method of claim 1 wherein the step of assuming fixed values comprises assuming for at least one pre-set weight, a pre-set weight value and for the remaining weights the weight values are determined by determining and solving the equations with the pre-set weight value.

4. The method of claim 1, wherein the step of determining calibration equations comprises at least one determination of an equation carried out several times and the coefficients of the equation being calculated by averaging the determinations.

5. The calibration method according to claim 4, wherein the step of determining calibration equations comprises carrying out the determination $2^n$ times, whereby n is a natural number.

6. The method of claim 1 further comprising a step of enabling or disabling each weight, wherein at least one equation is determined twice with the weights being enabled or disenabled complementary between the two determinations.

7. The method of claim 6 further comprising a step of determining from the equations essentially complementary to one another through subtraction the at least one equation with an eliminated offset.

8. The method of claim 7 further comprising a step of enabling or disenabling a weight based upon a binary code value, whereby each place of the binary code value which indicates for a corresponding weight whether the weight is enabled or disenabled.

9. The method of claim 8 further comprising a step of determining at least one equation by a first binary code being converted into an equivalent binary code, whose sum of the weight values of the weights enabled is equal to the sum of the weight values of the weights enabled according to the first binary code, and the equation is determined by comparing the first binary code with the equivalent binary code.

10. The method of claim 9, wherein the step of determining the equivalent binary code comprising:
    (a) determining the first binary code, so that a bit value 0 or 1 is assigned to a specific weight and a bit value 1 or 0 complementary to this is assigned to all weights with a lower weight value, whereby 0 corresponds to a disenabled weight and 1 corresponds to an enabled weight;
    (b) forming a second binary code by forming the complementary binary code of the first binary code;
    (c) forming a third binary code by modifying the bit values of the second binary code under the constraint that the sum of the weight values of the weights enabled according to the third binary code apart from an offset is equal to the sum of the weight values of the enabled weights according to the second binary code;
    (d) forming a fourth binary code by forming the complementary binary code of the third binary code; and
    (e) forming the equivalent binary code by modifying the bit values of the fourth binary code under the constraint that the sum of the weight values of the weights enabled according to the equivalent binary code apart from an offset is equal to the sum of the weight values of the enabled weights according to the fourth binary code.

11. The method of claim 9, wherein in step (a) the bit values of the first binary code, which correspond to weights with a greater weight value than that of the specific weight, are set in such a manner that the sum of the weight values of the weights enabled according to the first binary code essentially lies in the center of the range of the possible sums of the weight values of the weights enabled according to an arbitrary binary code.

12. The method of claim 9, wherein the step of determining the equivalent binary code comprises:
    (a) determining a second binary code, so that a bit value 0 or 1 is assigned to a specific weight and a bit value 1 or 0 complementary to this is assigned to all weights with a lower weight value, whereby 0 corresponds to a disenabled weight and 1 corresponds to an enabled weight;
    (b) forming a third binary code by modifying the bit values of the second binary code under the constraint that the sum of the weight values of the weights enabled according to the third binary code apart from an offset is equal to the sum of the weight values of the enabled weights according to the second binary code;
    (c) forming a fourth binary code by forming the complementary binary code of the third binary code; and
    (d) forming the equivalent binary code by modifying the bit values of the fourth binary code under the constraint that the sum of the weight values of the weights enabled according to the equivalent binary code apart from an offset is equal to the sum of the weight values of the enabled weights according to the fourth binary code, whereby the first binary code is produced by forming the complementary binary code of the second binary code.

13. The method according to claim 8, wherein the step of determining the equivalent binary code comprises:
    (a) determining a second binary code, so that a bit value 0 or 1 is assigned to a specific weight and a bit value 1 or 0 complementary to this is assigned to all weights with a lower weight value, whereby 0 corresponds to a disenabled weight and 1 corresponds to an enabled weight;
    (b) forming a third binary code by modifying the bit values of the second binary code under the constraint that the sum of the weight values of the weights enabled according to the third binary code apart from an offset is equal to the sum of the weight values of the enabled weights according to the second binary code;

(c) forming a fourth binary code by forming the complementary binary code of the third binary code; and (d) forming the equivalent binary code by modifying the bit values of the fourth binary code under the constraint that the sum of the weight values of the weights enabled according to the equivalent binary code apart from an offset is equal to the sum of the weight values of the enabled weights according to the fourth binary code, whereby the equation is determined by comparing the second binary code with the equivalent binary code.

14. The method of claim 8, wherein a measurement carried out for execution of the method is iterated on the weighted network and the average value of the iterated measurements is evaluated.

15. An A/D or D/A converter having a weighted network comprising:

a control unit provided for calibrating the network and configured in such a manner that for calibration the control unit determines equations between the weights, whereby in an equation a weight is represented as a function of other weights, and that the control unit solves the equations for determining the weight values of the weights, wherein the control unit is configured in such a manner that, for at least one ratios between the types of weight of two weights, fixed values are stored and for the remaining weights the weight values are determined by determining and solving the equations with the fixed values of the ratios.

16. The A/D or D/A converter of claim 15, wherein the control unit is configured in such a manner that, for at least one pre-set weight, a pre-set weight value is stored and for the remaining weights the weight values are determined by determining and solving the equations with the pre-set weight value.

17. The A/D or D/A converter of claim 15, wherein the control unit is configured in such a manner that at least one determination of an equation is carried out several times and the coefficients of the equation are calculated by averaging the determinations carried out several times.

18. The A/D or D/A converter of claim 15, whereby each weight is designed to be enabled and disenabled by enabling means, wherein the control unit is configured in such a manner that at least one equation is determined twice with the weights being enabled or disenabled of complementary between the two determinations, in order to obtain equations essentially complementary to one another and from the two equations essentially complementary to one another at least one equation with an eliminated offset is determined by subtraction.

19. The A/D or D/A converter of claim 15, whereby the control unit enables or disenables each weight in agreement with a corresponding binary code by way of enabling means, whereby each place of the binary code indicates for a corresponding weight whether this weight is enabled or disenabled, wherein the control unit is configured in such a manner that at least one equation is determined, by a first binary code being converted into an equivalent binary code, whose sum of the weight values of the weights enabled is equal to the sum of the weight values of the enabled weights according to the first binary code and the equation is determined by comparing the first binary code with the equivalent binary code.

20. The A/D or D/A converter of claim 15, whereby the network has weights with respective weight values, and whereby the control unit is provided for the calibration of the network, which is configured in such a manner that for calibration it determines equations between the weights, whereby in an equation a weight is represented in each case as a function of other weights, whereby the control unit enables or disenables each weight in agreement with a corresponding binary code by way of enabling means, whereby each place of the binary code indicates for a corresponding weight whether this weight is enabled or disenabled, wherein the control unit is configured in such a manner that an offset of the A/D or D/A converter is calculated, whereby said offset is calculated by a first binary code being converted into a second binary code through modification of the bit values of the first binary code under the constraint that the sum of the weight values of the weights enabled according to the first binary code apart from an offset is equal to the sum of the weight values of the enabled weights according to the second binary code, and that a conversion result is corrected by the amount of the offset determined in this way.

\* \* \* \* \*